United States Patent
Hsieh et al.

(10) Patent No.: US 8,781,213 B2
(45) Date of Patent: *Jul. 15, 2014

(54) OPTICAL ALIGNMENT SYSTEMS FOR FORMING LEDS HAVING A ROUGH SURFACE

(75) Inventors: Robert L. Hsieh, Los Altos, CA (US); Khiem Nguyen, San Jose, CA (US); Warren W. Flack, San Jose, CA (US); Andrew M. Hawryluk, Los Altos, CA (US)

(73) Assignee: Ultratech, Inc., San Jose, CA (US)

(*) Notice: Subject to any disclaimer, the term of this patent is extended or adjusted under 35 U.S.C. 154(b) by 190 days.

This patent is subject to a terminal disclaimer.

(21) Appl. No.: 13/302,308

(22) Filed: Nov. 22, 2011

(65) Prior Publication Data
US 2012/0062726 A1   Mar. 15, 2012

Related U.S. Application Data

(63) Continuation of application No. 12/952,735, filed on Dec. 2, 2009, now Pat. No. 8,088,633.

(51) Int. Cl.
*G06K 9/00* (2006.01)
*G03F 9/00* (2006.01)
*H01L 33/22* (2010.01)

(52) U.S. Cl.
CPC ............ *G03F 9/7084* (2013.01); *G03F 9/7088* (2013.01); *G03F 9/7065* (2013.01); *H01L 33/22* (2013.01); *G03F 9/708* (2013.01); *G03F 9/7076* (2013.01)
USPC .................. 382/151; 356/401; 438/7; 438/16

(58) Field of Classification Search
USPC ....... 219/385; 356/401, 620; 382/151; 438/7, 438/16
See application file for complete search history.

(56) References Cited

U.S. PATENT DOCUMENTS

| | | |
|---|---|---|
| 4,780,617 A | 10/1988 | Umatate et al. |
| 5,381,121 A | 1/1995 | Endner et al. |

(Continued)

FOREIGN PATENT DOCUMENTS

| | | |
|---|---|---|
| JP | 08-339957 | 12/1996 |
| JP | 2006-100474 | 4/2006 |
| JP | 2009-130027 | 6/2009 |
| JP | 2008-158696 | 7/2009 |

OTHER PUBLICATIONS

Japanese office action from Japanese Patent Office for Japanese counterpart patent application No. 2010-255740 to above-identified US patent application.

(Continued)

*Primary Examiner* — Gregory M Desire
(74) *Attorney, Agent, or Firm* — Opticus IP Law PLLC

(57) ABSTRACT

An alignment system for aligning a wafer when lithographically fabricating LEDs having an LED wavelength $\lambda_{LED}$ is disclosed. The system includes the wafer. The wafer has a roughened alignment mark with a root-mean-square (RMS) surface roughness $\sigma_S$. The system has a lens configured to superimpose an image of the reticle alignment mark with an image of the roughened alignment mark. The roughened alignment marked image is formed with alignment light having a wavelength $\lambda_A$ that is in the range from about $2\sigma_S$ to about $8\sigma_S$. An image sensor detects the superimposed image. An image processing unit processes the detected superimposed image to measure an alignment offset between the wafer and the reticle.

20 Claims, 7 Drawing Sheets

(56) References Cited

U.S. PATENT DOCUMENTS

| | | | |
|---|---|---|---|
| 5,381,210 A | 1/1995 | Hagiwara | |
| 5,402,205 A | 3/1995 | Markle et al. | |
| 5,621,813 A | 4/1997 | Brown et al. | |
| 5,654,553 A * | 8/1997 | Kawakubo et al. | 250/548 |
| 5,734,478 A * | 3/1998 | Magome et al. | 356/401 |
| 6,455,877 B1 | 9/2002 | Ogawa et al. | |
| 6,744,512 B2 * | 6/2004 | Takahashi | 356/401 |
| 7,186,580 B2 | 3/2007 | Tran et al. | |
| 7,259,399 B2 | 8/2007 | Lee et al. | |
| 7,436,001 B2 | 10/2008 | Lee et al. | |
| 7,909,253 B2 * | 3/2011 | Sherman | 235/454 |
| 8,088,633 B2 * | 1/2012 | Hsieh et al. | 438/16 |
| 2001/0055117 A1 | 12/2001 | Mizutani | |
| 2005/0224816 A1 | 10/2005 | Kim et al. | |
| 2007/0114511 A1 | 5/2007 | Kim et al. | |
| 2007/0134834 A1 | 6/2007 | Lee et al. | |
| 2007/0202624 A1 | 8/2007 | Yoon et al. | |
| 2007/0219736 A1 | 9/2007 | Okita | |
| 2009/0087994 A1 | 4/2009 | Lee et al. | |
| 2012/0133913 A1 | 5/2012 | Okita | |

OTHER PUBLICATIONS

Chinese office action from Chinese Patent Office for Chinese counterpart patent application No. 201010567087.2 to above-identified US patent application.

E. Fred Shubert, "Light-Emitting Diodes" 2nd Ed., Cambrige Univ. Press, 2006, pp. 150-156.

* cited by examiner

OPTICAL ALIGNMENT SYSTEMS FOR FORMING LEDS HAVING A ROUGH SURFACE

CROSS-REFERENCE TO RELATED APPLICATIONS

This application is a continuation of U.S. patent application Ser. No. 12/592,735, filed on Dec. 2, 2009, which Application is incorporated herein by reference.

FIELD

The present invention relates generally to optical alignment in lithography, and in particular to systems for performing optical alignment when fabricating light-emitting diodes (LEDs) having a rough surface.

BACKGROUND ART

LEDs are used for a variety of lighting applications (e.g., full-color displays, lamps, traffic lights, etc.), and are increasingly finding additional applications as LED technology improves and the cost of LEDs decreases.

LEDs are fabricated using lithographic techniques, which include using alignment methods to aligning adjacent layers of the LED structure. Many LEDs include a rough upper surface with a surface roughness comparable to the wavelength of light generated by the LED. The rough surface allows light that is otherwise trapped by total internal reflection to escape the LED structure, thereby increasing the LED light output.

While the rough surface improves LED light output, it also interferes with the alignment imaging. Lithography requires precise alignment between an existing layer and a subsequent layer. Alignment is typically accomplished using pattern recognition techniques based on an alignment structures or "alignment marks." In a preferred case, an image of wafer and reticle alignment marks respectively associated with the wafer and the reticle (mask) is captured by a Machine Vision System (MVS), such as described in U.S. Pat. No. 5,621,813. Typically, visible-wavelength light is used for alignment imaging. The alignment mark images are displayed so that an operator can check the relative alignment. The relative position of the alignment marks is used to adjust the relative position of the wafer and reticle of the lithography system until their alignment is established.

Unfortunately, the rough surface of the LED scatters the imaging light and degrades the quality of the MVS image (or the diffraction signal) used to carry out alignment. Accordingly, improved methods are needed to perform alignment when fabricating LEDs using lithographic techniques when the LEDs have a roughened surface that interferes with alignment mark imaging.

SUMMARY

An aspect of the disclosure is an alignment system for aligning a wafer when lithographically fabricating on the wafer a LED having a wavelength $\lambda_{LED}$. The system includes the wafer, with the wafer having at least one wafer alignment mark. A rough surface is formed on or above the wafer alignment mark and on a layer having a refractive index n, the rough surface having a root-mean-square (RMS) surface roughness $\sigma_S$ that is within one of the following ranges: i) from about $2\lambda_{LED}$ to about $8\lambda_{LED}$; ii) from about $(0.5)\lambda_{LED}/n$ to $\lambda_{LED}/n$; or iii) from about $\lambda_{LED}/n$ to $\lambda_{LED}$. The system also has a light source that illuminates the at least one wafer alignment mark with alignment light having a wavelength $\lambda_A$ that is in the range from about $2\sigma_S$ to about $8\sigma_S$. The system further includes a lens configured to form an image of the at least one wafer alignment mark at the alignment light wavelength $\lambda_A$. The system also has an image sensor configured to detect the image and form therefrom a digital alignment mark image. The system further includes an image processing unit electrically connected to the image sensor and that is configured to receive and compare the digital alignment mark image to an alignment reference to establish a wafer alignment with respect to the alignment reference.

Another aspect of the disclosure is alignment system for aligning a wafer to a reticle having a reticle alignment mark when lithographically fabricating, with a lithography system having a projection lens, a LED having an LED wavelength $\lambda_{LED}$. The system includes the wafer, wherein the wafer includes a roughened alignment mark having a root-mean-square (RMS) surface roughness $\sigma_S$. The system includes a lens configured to superimpose an image of the reticle alignment mark with an image of the roughened alignment mark as formed with alignment light having a wavelength $\lambda_A$ that is in the range from about $2\sigma_S$ to about $8\sigma_S$. The system further includes an image sensor configured to detect the superimposed image and form therefrom digital superimposed image representative of the superimposed image. The system also has an image processing unit electrically connected to the image sensor. The image processing unit is adapted to receive the digital superimposed image and perform pattern recognition of the digital superimposed image to measure an alignment offset between the wafer and reticle.

Another aspect of the disclosure is an alignment system for aligning a wafer to a reticle having a reticle alignment mark when lithographically fabricating, with a lithography system with a projection lens, a LED having an LED wavelength $\lambda_{LED}$. The system includes the wafer, wherein the wafer includes a roughened alignment mark having a root-mean-square (RMS) surface roughness $\sigma_S$. The system also includes the projection lens, with projection lens configured to work in conjunction with a lens to form a superimposed image that includes: i) an image of the roughened alignment mark formed with alignment light having a wavelength $\lambda_A$ that is in the range from about $2\sigma_S$ to about $8\sigma_S$, and ii) an image of the reticle alignment mark. The system also includes an image sensor configured to detect the superimposed image and form therefrom digital superimposed image representative of the superimposed image. The system also includes an image processing unit electrically connected to the image sensor. The image processing unit is adapted to receive the digital superimposed image and perform pattern recognition of the digital superimposed image to measure an alignment offset between the wafer and reticle.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

DETAILED DESCRIPTION

Reference is now made in detail to the present preferred embodiments of the invention, examples of which are illustrated in the accompanying drawings. Whenever possible, the same or like reference numbers and symbols are used throughout the drawings to refer to the same or like parts. The terms "above" and "below" are relative terms used to facilitate the description and are not intended as being strictly limiting.

Figure 1A:
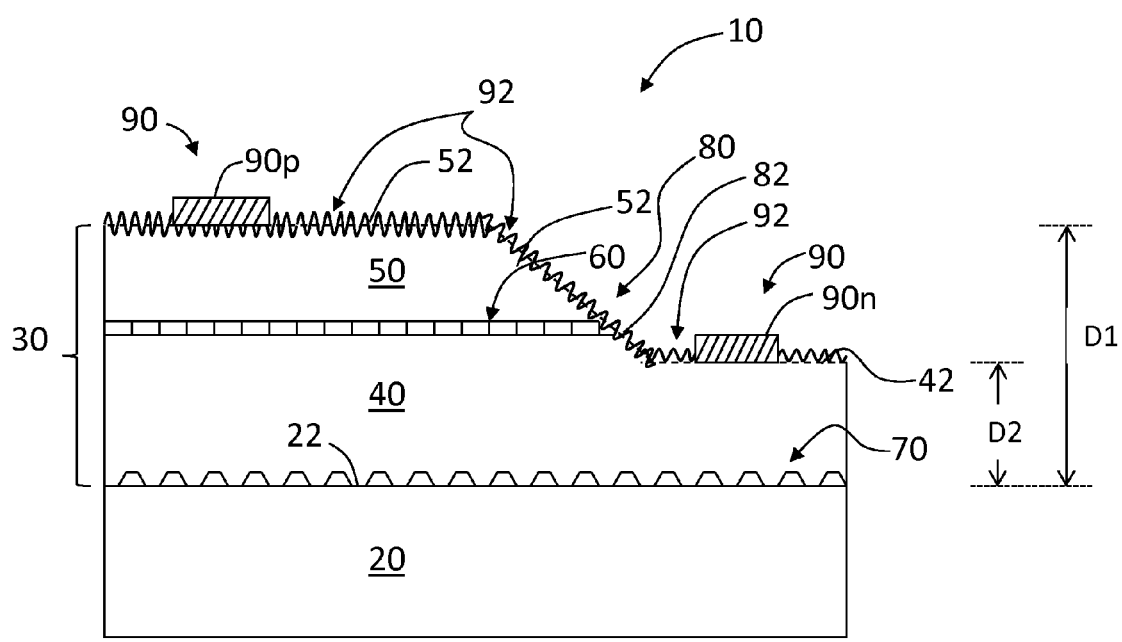
FIG. 1A is a schematic cross-sectional diagram of an example LED based on gallium nitride (GaN) and shows a rough upper surface on the p-GaN layer through which light escapes.

FIG. 1A is a schematic cross-sectional diagram of an example LED 10 based on a gallium nitride (GaN) LED structure. Example Ga-based LEDs are described in U.S. Pat. Nos. 6,455,877 and 7,259,399 and 7,436,001, which patents are incorporated by reference herein. The present invention is not limited to Ga-based LEDs, and is directed to any type of LED formed using a wafer-based manufacturing process wherein a wafer alignment mark on or beneath a rough surface needs to be imaged to carry out wafer alignment. Here, "wafer" means any substrate used to support the manufacture of LED 10. In some instances, the term "wafer" refers to the substrate plus additional process layers added to the substrate in forming the LED. Portions of LED 10 that comprise less than the entire working LED are referred to generally as the "LED structure."

LED 10 includes a substrate 20 having a surface 22. Example materials for substrate 20 include sapphire, SiC, GaN Si, etc. Disposed atop substrate 20 is a GaN multilayer structure 30 that includes a n-doped GaN layer ("n-GaN layer") 40 and a p-doped GaN layer ("p-GaN layer") 50 with a surface 52. The n-GaN layer 40 and the p-GaN layer 50 sandwich an active layer 60, with the n-GaN layer being adjacent substrate 20. In other Ga-based LED embodiments, GaN multilayer structure 30 is reversed so that the p-GaN layer 50 is adjacent substrate 20. Active layer 60 comprises, for example, a multiple quantum well (MQW) structure such as undoped GaInN/GaN superlattices. GaN multilayer structure 30 thus defines a p-n junction. A patterned reflective layer 70 is included at substrate surface 22. An example pitch for patterned reflective layer 70 is between about 3 microns to about 6 microns.

Figure 1B:
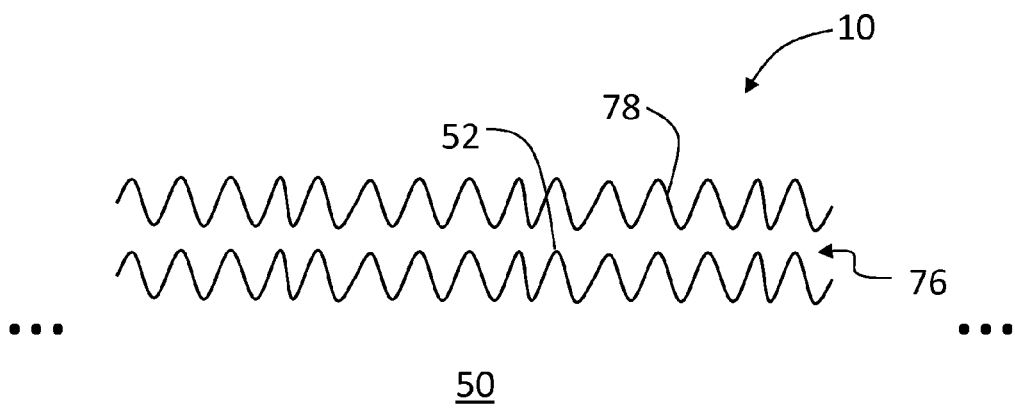
FIG. 1B is a close-up view of a portion of the LED structure showing a transparent conducting layer atop the p-GaN layer that also has a surface roughness comparable to the layer below.

In example embodiments, a transparent conducting layer (TCL) 76 is formed atop GaN multilayer structure 30 (e.g., by coating the entire wafer), as illustrated in the close-up view of FIG. 1B that shows an upper portion of the LED structure. Note how the surface roughness from surface 52 of the underlying p-GaN layer 50 is present on TCL surface 78.

Figure 1C:
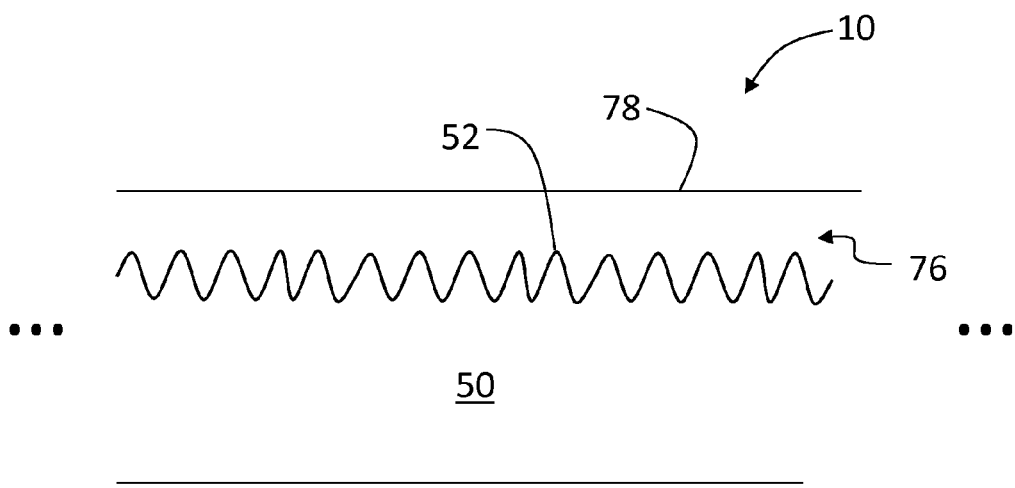
FIG. 1C is similar to FIG. 1B except that the top surface of the transparent conducting layer is flat.

FIG. 1C is similar to FIG. 1B but shows TCL surface 78 as being flat. The discussion below refers to an example LED 10 that does not include TCL 76 for ease of illustration and explanation, but it can also include the TCL.

With reference again to FIG. 1A, LED 10 further includes a sloped portion 80 formed in GaN multilayer structure 30, where the sloped portion includes a sloped surface 82. Sloped portion 80 forms an exposed surface 42 of n-GaN layer 40 that acts as a ledge for supporting one of two electrical contacts 90, namely n-contact 90n. Example n-contact materials include Ti/Au, Ni/Au, Ti/Al, or combination thereof. The other electrical contact 90 is the p-contact 90p, which is arranged on p-GaN surface 52. Example p-contact materials include Ni/Au and Cr/Au. An example distance D1 is about 4 microns, and an example distance D2 is about 1.4 microns. An example LED 10 is typically 1 mm×1 mm square and is designed to emit light at a wavelength $\lambda_{LED}$.

In an example embodiment of LED 10, surfaces 42, 52 and 82 constitute portions of a rough surface 92. Rough surface 92 may be formed, for example, by plasma etching the entire wafer, as discussed in greater detail below. Here, "rough" is understood as being randomly or quasi-randomly textured to the point that it interferes with the optical imaging of wafer alignment marks. An example height of a surface feature formed on rough surface 92 using plasma etching is about 500 nm, which is very close to the 520 nm imaging wavelength used in most prior art MVS alignment tools. In an example embodiment, rough surface 92 has a root mean square (RMS) roughness $\sigma_S$ which is determined by the LED output wavelength $\lambda_{LED}$ in order to optimize LED light output. In one example, the RMS roughness $\sigma_S$ is approximately 0.5 to 1.0 times the LED wavelength $\lambda_{LED}$ in the layer that supports roughened surface 92 and that has a refractive index n. Hence, in an example embodiment the RMS surface roughness $\sigma_S$ is in the range from about $(0.5)\lambda_{LED}/n$ to about $\lambda_{LED}/n$, where n is the index of refraction of the media, e.g., of p-GaN layer 50, for which n is about 2.5 at a wavelength of about 470 nm. In another example embodiment, RMS surface roughness $\sigma_S$ is between about $\lambda_{LED}/n$ and about $\lambda_{LED}$.

Note that in the case where TCL 76 is used, this layer can be either directly roughened (e.g., via the aforementioned plasma etch) or can be deposited substantially conformally atop the existing roughened surface 92 so that its surface 78 is also roughened (FIG. 1B). In this case, wafer alignment marks may reside beneath the uppermost (transparent) roughened surface 78. Also, TCL layer surface 78 may also be planar so that the main scattering surface is roughened surface 92 (FIG. 1C).

Optical Alignment

Figure 2:
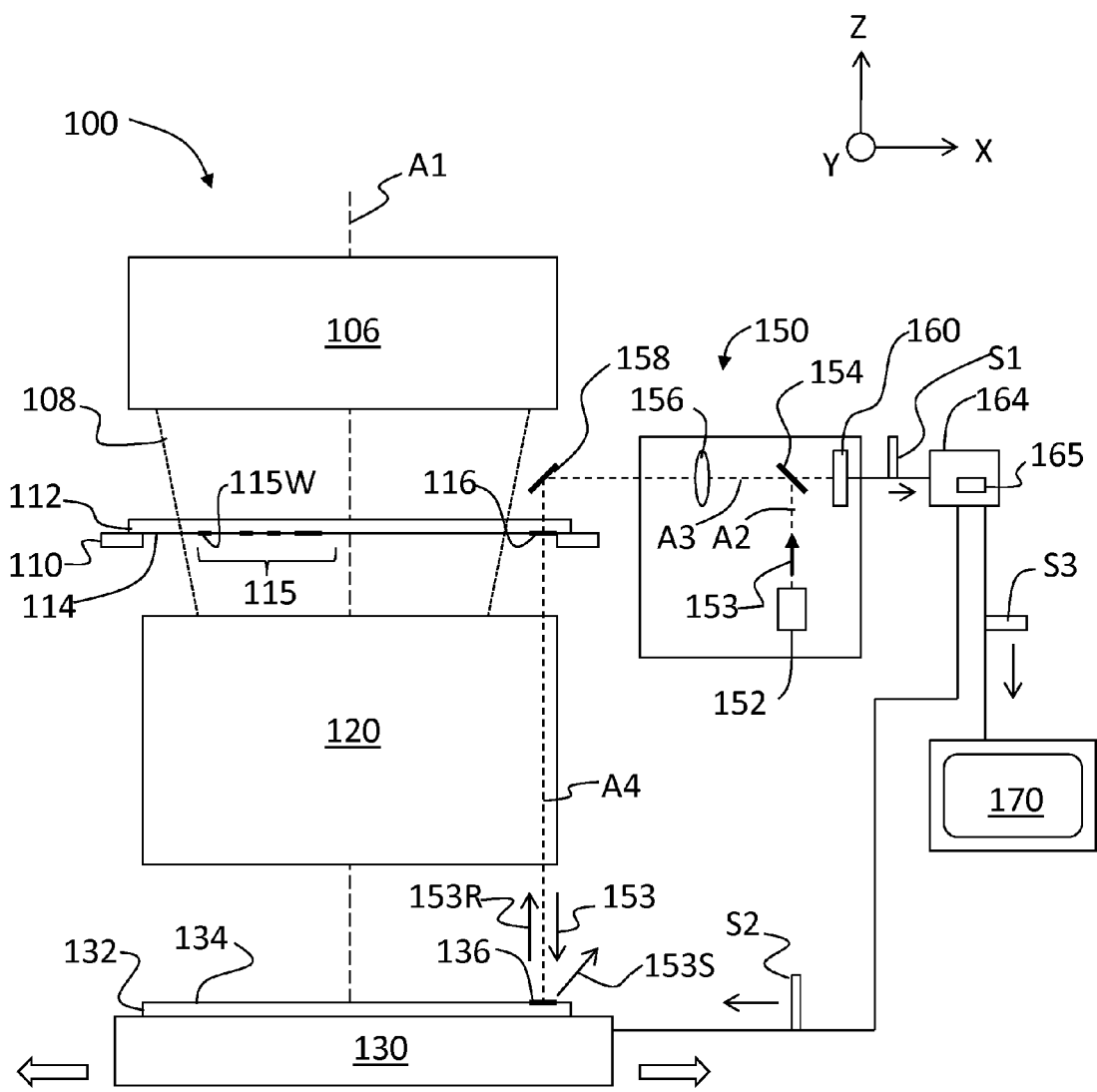
FIG. 2 is a schematic diagram of an example lithography system used to form LEDs and that includes an example through-the-lens (TTL) optical alignment system suitable for carrying out optical alignment according to methods of the present invention.

FIG. 2 is a schematic diagram of an example lithography system 100 that includes a "through the lens" optical alignment system 150. Example optical alignment systems are disclosed in U.S. Pat. Nos. 5,402,205 and 5,621,813, which patents are incorporated by reference herein. Cartesian X-Y-Z coordinates are shown for reference.

Figure 4A:
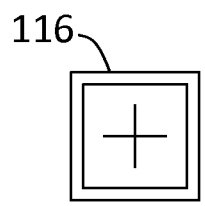
FIG. 4A is a plan view of an example reticle alignment mark.
Figure 4B:
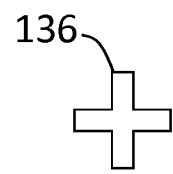
FIG. 4B is a plan view of an example wafer alignment mark.

Lithography system 100 includes, along a system axis A1, an illuminator 106, a reticle stage 110, a projection lens 120, and a moveable wafer stage 130. Reticle stage 110 supports a reticle 112 having a surface 114 with a reticle pattern 115 and a reticle alignment mark 116 (see also FIG. 4A) formed thereon. Wafer stage 130 supports a wafer 132 (e.g., substrate 20) having an upper surface 134 with a wafer alignment mark 136 formed thereon (see FIG. 4B). In an example embodiment, wafer alignment mark 136 may be diffractive. In the examples below, wafer alignment mark 136 is assumed to be non-diffractive for the sake of illustration.

Figure 3:
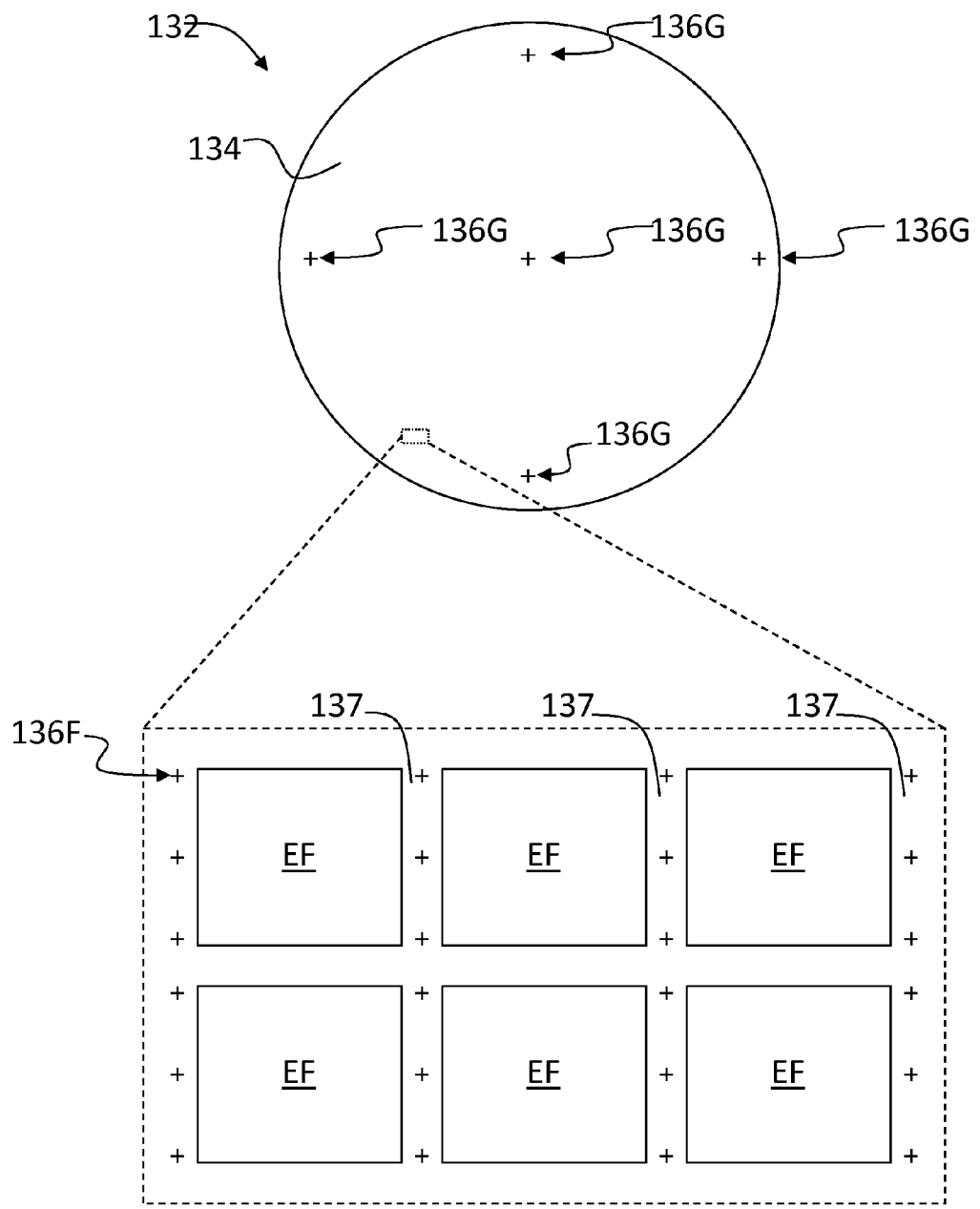
FIG. 3 is a plan view of an example wafer showing in the close-up inset example exposure fields, and also showing global and fine wafer alignment marks.

FIG. 3 is a plan view of an example wafer 132 that has global alignment marks 136G used for global alignment, as well as fine wafer alignment marks 136F associated with exposure fields EF and used for fine alignment (see close-up inset). Note that in the example shown that both types of wafer alignment marks 136 reside in scribe areas 137 between or adjacent exposure fields EF.

When light 108 from illuminator 106 illuminates reticle 112 and pattern 115 thereon, the pattern is imaged onto wafer surface 134 over a select exposure field EF via projection lens 120. Pattern 115 includes alignment patterns 115W used to form wafer alignment marks 136. Wafer surface 134 is typically coated with a light-sensitive material such as photoresist (not shown) so that reticle pattern 115 can be recorded and transferred to wafer 132.

Wafer 132 typically includes many different layers that form the LED structure of LED 10, as described above. The typical wafer 132 is used to form a relatively large number (e.g., thousands) of LEDs, with each of the device layers being formed in a step-and-repeat or scanned fashion and then processed together. Thus, prior to imaging reticle pattern 115 onto wafer surface 134 for the different exposure fields EF, the reticle pattern must be properly aligned to the previously formed layer, and in particular to the previously formed exposure fields. This is accomplished by aligning wafer 132 relative to reticle 112 using one or more wafer alignment marks 136 and an alignment reference, which in optical alignment system 150 is one or more reticle alignment marks 116.

With reference again to FIG. 2, an example optical alignment system 150 includes a light source 152 arranged along an axis A2 and that emits alignment light 153 of wavelength $\lambda_A$. A beam splitter 154 is arranged at the intersection between axis A2 and a perpendicular axis A3. A lens 156 and a fold minor 158 are arranged along axis A3. Fold minor 158 folds axis A3 to form an axis A4 that is parallel to lithography system axis A1. Axis A4 travels through reticle 112, through projection lens 120 and to wafer 132. Optical alignment system 150 also includes an image sensor 160 arranged along axis A3 adjacent beam splitter 154 on the side opposite lens 156 and fold mirror 158. Image sensor 160 is electrically connected to an image processing unit 164 configured to process digital images captured by image sensor 160. Image processing unit 164 is electrically connected to a display unit 170 and also to moveable wafer stage 130.

In the operation of optical alignment system 150, alignment light 153 from light source 152 travels along axis A2 and is reflected by beam splitter 154 along axis A3 towards lens 156. Alignment light 153 passes through lens 156 and is reflected by fold mirror 158 to pass through reticle 112 and projection lens 120 and to illuminate a portion of wafer surface 134, including wafer alignment mark 136. A portion 153R of alignment light 153 is reflected from wafer surface 132 and wafer alignment mark 136 and travels back through projection lens and through reticle 112, and particular through reticle alignment mark 116. In the case where wafer alignment mark 136 is diffractive, then the diffracted light from the wafer alignment mark is collected.

Figure 4C:
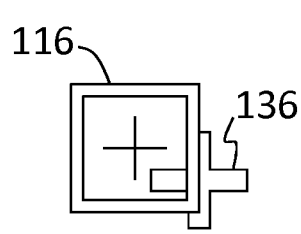
FIG. 4C is a plan view of an example superimposed image of the reticle and wafer alignment marks, wherein the two marks are offset due to a misalignment of the reticle and wafer.

The combination of projection lens 120 and lens 156 forms from reflected light 153R a superimposed image of the wafer alignment mark 136 and reticle alignment mark 116 on image sensor 160 (see FIG. 4C). Here, reticle alignment mark 116 serves as an alignment reference. In other types of optical alignment systems such as off-axis systems, the alignment reference is the alignment system optical axis as calibrated based on lithography system fiducials.

Image sensor 160 generates an electrical signal S1 representative of the captured digital image and sends it to image processing unit 164. Image processing unit 164 is adapted (e.g., via image processing software embodied in a computer-readable medium such as a memory unit 165), to perform image processing of the received digital image. In particular, image processing unit 164 is adapted to perform pattern recognition of the superimposed wafer and reticle alignment mark images to measure their relative displacement and generate a corresponding stage control signal S2 that is sent to wafer stage 130. Image processing unit 164 also sends an image signal S3 to display unit 170 to display the superimposed wafer and reticle alignment mark images.

Figure 4D:
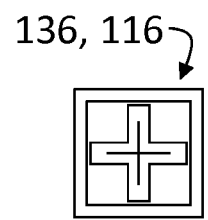
FIG. 4D is similar to FIG. 4C but shows an example where the reticle and alignment mark images are directly superimposed due to alignment of the reticle and wafer.

In response to stage control signal S2, wafer stage 130 moves in the X, Y plane (and also in the Z-plane, if necessary, for focusing purposes) until the images of reticle and wafer alignment marks 116 and 136 are aligned (i.e., directly superimposed), indicating proper alignment of reticle 112 and wafer 132. FIG. 4C shows an example of superimposed images of reticle and wafer alignment marks 116 and 136, wherein the two alignment mark images are offset due to a misalignment. FIG. 4D shows an example superimposed image of reticle and wafer alignment marks 116 and 136 wherein the two alignment mark images are aligned (i.e., directly superimposed) via the feedback operation of image processing unit 164 and movable wafer stage 130.

Often, the location of the individual LEDs 10 on wafer 132 is accurate to a few nanometers. Alignment systems such as optical alignment system 150 typically identify and locate a small number of the aforementioned global alignment marks 136G (typically 3-5 marks). This information, along with other information provided through the alignment algorithm in image processing unit 164, allows for the image processing unit to calculate the Cartesian coordinate system and the location of each individual exposure field EF on the wafer 132. This type of alignment is called Enhanced Global Alignment or EGA. This approach can accommodate linear corrections to the coordinate system (i.e., linear magnification terms in X, and Y, and a rotation angle between the two coordinate systems).

Figure 5A:
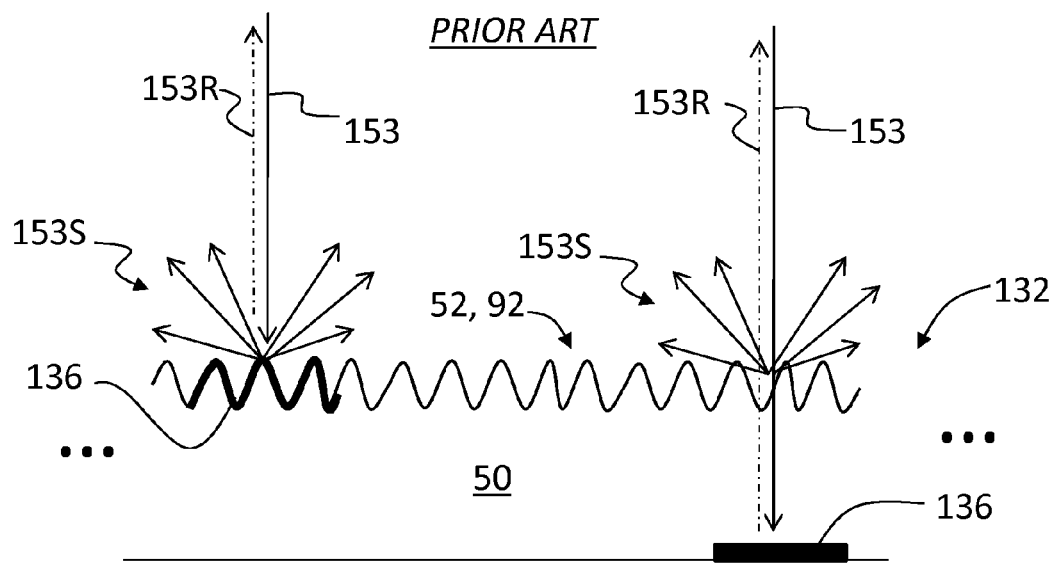
FIG. 5A is a schematic cross-sectional view of the top portion of the wafer showing the rough surface of the LED structure with the alignment mark formed therein, showing how in the prior art alignment method, the alignment light is scattered, leaving insufficient reflected light to form an image of the wafer alignment mark when performing wafer alignment.

As illustrated in the schematic diagram of FIG. 5A, prior art optical alignment systems and methods have difficulty imaging wafer alignment marks 136 on or through a rough surface such as rough surface 92 because the incident alignment light 153 is scattered by Rayleigh scattering, forming scattered light 153S. This leaves very little reflected light 153R left to form an image of wafer alignment mark 136. In Rayleigh scattering, the total scattered power $P_s$ scales as $P_s \sim a^6/\lambda^4$, where a is the size of the scattering particle and $\lambda$ is the wavelength of the incident light. For LED 10, the value of a represents the roughness scale of rough surface 92 and thus corresponds to RMS surface roughness $\sigma_S$.

The value of $\sigma_S$ is typically chosen to optimize light extraction of LED light of wavelength $\lambda_{LED}$ and so cannot be reduced without sacrificing the improvement to LED output. This results in the wafer alignment marks 136 formed on or beneath rough surface 92 being essentially invisible when the alignment wavelength $\lambda_A$ is the same as or close to the value of $\sigma_S$. Such a wafer alignment mark 136 is referred to hereinbelow as a "roughened wafer alignment mark" and has the same or substantially the same roughness as rough surface 92. Roughened wafer alignment marks 136 make it difficult if not impossible to place p-contact 90p and n-contact 90n in their proper locations on the LED structure.

Figure 5B:
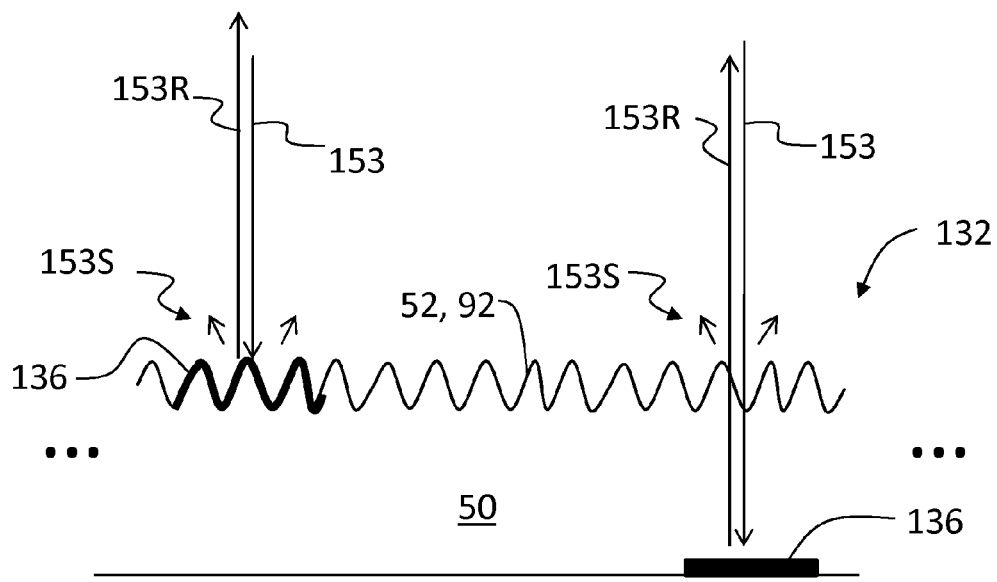
FIG. 5B is similar to FIG. 5A, but shows the alignment method of the present invention wherein the alignment light wavelength is such that there is a strong reflected light component sufficient to form an image of the wafer alignment mark and suitable when performing wafer alignment.

It is recognized in the present invention that the degradation in the alignment capability when attempting to form at least one of electrical contacts 90 is driven by Rayleigh scattering. With reference now to the schematic diagram of FIG. 5B, the present invention uses an alignment wavelength $\lambda_A$ that reduces the amount of scattered light 153S from roughened wafer alignment mark 136 so that there is more reflected light 153R. This improves the alignment capability of optical alignment system 150 for forming properly one or more aligned electrical contacts 90 on rough surface 92. For an example Ga-based LED 10 with a $\sigma_S$ of about 250 nm to about 500 nm, by increasing the alignment wavelength $\lambda_A$ from 500 nm (which is in the range of a typical prior art alignment wavelength $\lambda_A$) to 1,000 nm (1 μm) for example, the amount of scattered light 153S is reduced factor of 16. In an example embodiment of the present invention, the alignment wavelength $\lambda_A$ is in the range from about 1 μm and about 2 μm. In another example embodiment, the alignment wavelength $\lambda_A$ is in the range from about $2\sigma_S$ to about $8\sigma_S$. In another example embodiment, the alignment wavelength $\lambda_A$ is in the range from about $2\lambda_{LED}$ to about $8\lambda_{LED}$.

The alignment wavelength $\lambda_A$ used strikes a balance between reducing the effects of Rayleigh scattering and the ability to resolve the roughened wafer alignment marks 136. If the alignment wavelength $\lambda_A$ is too long, then the resolving capability of optical alignment system 150 is reduced. On the other hand, if the alignment wavelength $\lambda_A$ is too short, the effects of Rayleigh scattering are not sufficiently reduced. In addition, conventional image sensors 160 (as well as lens 156) tend to operate best at wavelengths less than about 2 μm. Lens 156 is designed to work in conjunction with projection lens 120 so that the superimposed reticle and wafer alignment mark image is in focus on image sensor 160. However, in the case where optical alignment system 150 is an off-axis alignment system (i.e., that does not have an optical path through projection lens 120), then lens 156 is designed as an imaging lens that images the reticle and wafer alignment marks 116 and 136 onto image sensor 160.

Figure 5C:
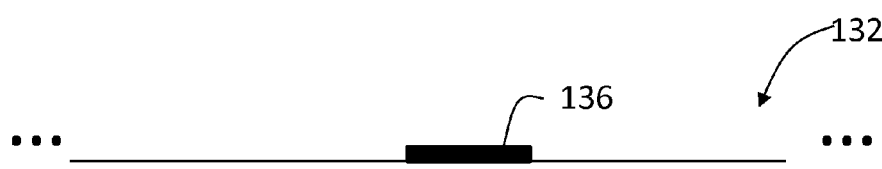
FIG. 5C and FIG. 5D schematically illustrate the formation of the wafer alignment mark on the wafer (FIG. 5C) and the formation of a rough surface above the alignment mark (FIG. 5D).
Figure 5D:
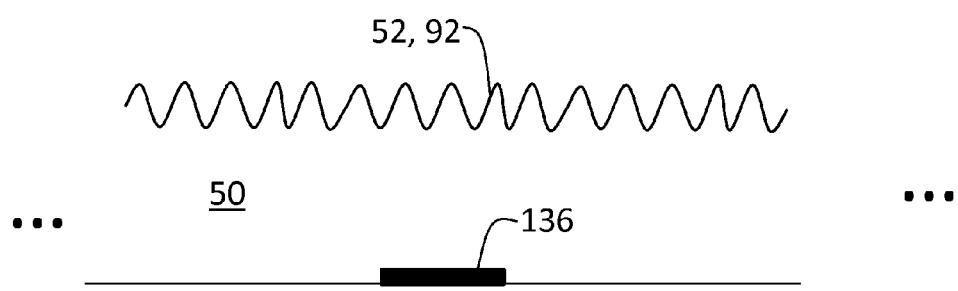

Thus, an example method of the present invention involves lithographically forming one or more LED 10 and includes forming at least one wafer alignment mark 136 on the wafer, and then forming a rough wafer surface on or above the wafer alignment mark (see FIGS. 5C and 5D), wherein the rough surface has a RMS surface roughness $\sigma_S$. The method also includes illuminating the at least one wafer alignment mark 136 with alignment light 153 having a wavelength $\lambda_A$ that is in the range from about $2\sigma_S$ to about $8\sigma_S$, and then forming and detecting an image of the illuminated wafer alignment mark at image sensor 160. The light for forming the wafer alignment mark image is reflected light 153R form by reflecting alignment light 153 from the at least one wafer alignment mark. The method then involves comparing the detected image of the at least one wafer alignment mark to an alignment reference (e.g., reticle alignment mark 116) to establish wafer alignment.

Another example method of the invention is a method of aligning wafer 132 when forming at least one electrical contact 90 on the LED structure when lithographically forming a LED 10. The method includes forming on wafer 132 at least one roughened alignment mark having a RMS surface roughness $\sigma_S$, and then imaging the at least one roughened wafer alignment mark with alignment light (e.g., reflected alignment light 153R) having a wavelength $\lambda_A$ that is in the range from about $2\sigma_S$ to about $8\sigma_S$. The method then involves comparing the detected image to an alignment reference to establish wafer alignment. The method then includes forming the at least one electrical contact 90 on the LED based on the established alignment. In one example, both p-contact 90p and n-contact 90n are formed.

Another example method of the invention includes forming at least one electrical contact 90 when lithographically forming LED 10. The method includes forming wafer alignment marks 136 on an upper surface 92 of the LED structure. The method then includes roughening the LED structure upper surface 92, including the wafer alignment marks thereon, thereby forming roughened wafer alignment marks, with the roughened upper surface 92 and roughened wafer alignment marks 136 having a surface roughness $\sigma_S$. The method also includes imaging the at least one roughened wafer alignment mark with alignment light having a wavelength $\lambda_A$ that is at least one of a) in the range from about $2\sigma_S$ to about $8\sigma_S$, b) in the range from about 1 μm to about 2 μm, and c) in the range from about $2\lambda_{LED}$ to about $8\lambda_{LED}$. The method then involves comparing the detected image to an alignment reference to establish wafer alignment, and forming the at least one electrical contact 90 (e.g., the p-contact 90p) on the LED structure upper surface (e.g., p-GaN layer 50 or atop the surface 78 of TCL 76).

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. An alignment system for aligning a wafer when lithographically fabricating on the wafer a light-emitting diode (LED) having a wavelength $\lambda_{LED}$, comprising:
   the wafer, with the wafer having at least one wafer alignment mark;
   a rough surface formed on or above the wafer alignment mark and on a layer having a refractive index n, the rough surface having a root-mean-square (RMS) surface roughness $\sigma_S$ that is within one of the following ranges:
   i) from about $2\lambda_{LED}$ to about $8\lambda_{LED}$;
   ii) from about $(0.5)\lambda_{LED}/n$ to $\lambda_{LED}/n$; or iii) from about $\lambda_{LED}/n$ to $\lambda_{LED}$;
- a light source that illuminates the at least one wafer alignment mark with alignment light having a wavelength $\lambda_A$ that is in the range from about $2\sigma_S$ to about $8\sigma_S$;
- a lens configured to form an image of the at least one wafer alignment mark at the alignment light wavelength $\lambda_A$;
- an image sensor configured to detect the image and form therefrom a digital alignment mark image; and
- an image processing unit electrically connected to the image sensor and configured to receive and compare the digital alignment mark image to an alignment reference to establish a wafer alignment with respect to the alignment reference.

2. The alignment system of claim 1, further comprising a reticle having a reticle alignment mark that serves as the alignment reference.

3. The alignment system of claim 2, wherein lithographically forming the LED includes using a lithography system having a projection lens, and wherein the lens and the projection lens work in conjunction to form the image of the at least one wafer alignment mark.

4. The alignment system of claim 3, wherein the lens and projection lens work in conjunction to form on the image sensor a superposition of an image of the reticle alignment mark and the wafer alignment mark image.

5. The alignment system of claim 1, wherein the alignment light wavelength $\lambda_A$ is in the range from about 1 µm to about 2 µm.

6. The alignment system of 1, further comprising the image processing unit configured to perform enhanced global alignment using multiple wafer alignment marks.

7. The alignment system of claim 1, wherein the layer upon which the rough surface is formed is either a p-GaN layer or a transparent conducting layer.

8. The alignment system of claim 1, wherein the alignment light from the light source passes through the lens to illuminate the at least one wafer alignment mark.

9. The alignment system of claim 1, wherein the lithography system includes a reticle with an alignment mark that serves as the alignment mark reference, and wherein the image processing unit is configured to perform pattern recognition of a digital alignment mark image and the reticle alignment mark to establish the wafer alignment.

10. The alignment system of claim 9, wherein the image processing unit is configured to control the lithography system to bring the wafer and the reticle into alignment base on the established wafer alignment.

11. An alignment system for aligning a wafer to a reticle having a reticle alignment mark when lithographically fabricating, with a lithography system having a projection lens, a light-emitting diode (LED) having an LED wavelength $\lambda_{LED}$, the system comprising:
- the wafer, wherein the wafer includes a roughened alignment mark having a root-mean-square (RMS) surface roughness $\sigma_S$;
- a lens configured to superimpose an image of the reticle alignment mark with an image of the roughened alignment mark as formed with alignment light having a wavelength $\lambda_A$ that is in the range from about $2\sigma_S$ to about $8\sigma_S$;
- an image sensor configured to detect the superimposed image and form therefrom digital superimposed image representative of the superimposed image; and
- an image processing unit electrically connected to the image sensor and adapted to receive the digital superimposed image and perform pattern recognition of the digital superimposed image to measure an alignment offset between the wafer and reticle.

12. The alignment system of claim 11, wherein the image processing unit is configured to generate a control signal that causes the lithography system to align the wafer and reticle.

13. The alignment system of claim 11, wherein the image processing unit is configured to perform enhanced global alignment using multiple roughened alignment marks.

14. The alignment system of claim 11, wherein the roughened alignment mark resides below a transparent conducting layer.

15. The alignment system of claim 11, wherein the lens works in conjunction with the projection lens to form the superimposed image.

16. The alignment system of claim 11, wherein the alignment light wavelength $\lambda_A$ is in the range from about 1 µm to about 2 µm.

17. The alignment system of claim 11, further comprising:
- a light source configured to generate the alignment light; and
- wherein the lens is configured to direct the alignment light to the roughened alignment mark and form the image of the roughened alignment mark with reflected alignment light.

18. An alignment system for aligning a wafer to a reticle having a reticle alignment mark when lithographically fabricating, with a lithography system with a projection lens, a light-emitting diode (LED) having an LED wavelength $\lambda_{LED}$, the system comprising:
- the wafer, wherein the wafer includes a roughened alignment mark having a root-mean-square (RMS) surface roughness $\sigma_S$;
- the projection lens, with projection lens configured to work in conjunction with a lens to form a superimposed image that includes: i) an image of the roughened alignment mark formed with alignment light having a wavelength $\lambda_A$ that is in the range from about $2\sigma_S$ to about $8\sigma_S$, and ii) an image of the reticle alignment mark;
- an image sensor configured to detect the superimposed image and form therefrom digital superimposed image representative of the superimposed image; and
- an image processing unit electrically connected to the image sensor and adapted to receive the digital superimposed image and perform pattern recognition of the digital superimposed image to measure an alignment offset between the wafer and reticle.

19. The alignment system of claim 18, wherein the roughened alignment mark is defined by an alignment mark having a layer formed thereon, wherein the layer includes a roughened upper surface.

20. The alignment system of claim 19, wherein the image processing unit is configured to perform enhanced global alignment.

* * * * *